United States Patent [19]
Woo

[11] Patent Number: 5,639,689
[45] Date of Patent: *Jun. 17, 1997

[54] METHOD FOR FABRICATING STORAGE ELECTRODE OF SEMICONDUCTOR DEVICE

[75] Inventor: Sang Ho Woo, Bubaleub, Rep. of Korea

[73] Assignee: Hyundai Electronics Industries Co., Ltd., Rep. of Korea

[*] Notice: The term of this patent shall not extend beyond the expiration date of Pat. No. 5,478,769.

[21] Appl. No.: 365,030

[22] Filed: Dec. 28, 1994

[30] Foreign Application Priority Data

Dec. 29, 1993 [KR] Rep. of Korea ............... 1993-30859
Dec. 29, 1993 [KR] Rep. of Korea ............... 1993-30864

[51] Int. Cl.$^6$ ..................... H01L 21/44; H01L 21/48
[52] U.S. Cl. ................. 437/193; 437/52; 437/60; 437/919; 437/191
[58] Field of Search ................. 437/52, 60, 919, 437/47, 48, 191, 193, 109

[56] References Cited

U.S. PATENT DOCUMENTS

| | | | |
|---|---|---|---|
| 4,143,178 | 3/1979 | Harada et al. | 437/191 |
| 4,240,196 | 12/1980 | Jacobs et al. | 437/191 |
| 5,053,351 | 10/1991 | Fazan et al. | 437/52 |
| 5,147,820 | 9/1992 | Chittipeddi et al. | 437/193 |
| 5,164,337 | 11/1992 | Ogawa et al. | 437/52 |
| 5,281,549 | 1/1994 | Fazan et al. | 437/52 |
| 5,298,436 | 3/1994 | Radosevich et al. | 437/191 |
| 5,350,698 | 9/1994 | Huang et al. | 437/26 |
| 5,371,039 | 12/1994 | Oguro | 437/191 |
| 5,441,904 | 8/1995 | Kim et al. | 437/191 |
| 5,478,769 | 12/1995 | Lim | 437/52 |

Primary Examiner—Charles L. Bowers, JR.
Assistant Examiner—Lynne A. Gurley
Attorney, Agent, or Firm—Merchant, Gould, Smith, Edell, Welter & Schmidt

[57] ABSTRACT

A method for fabricating a storage electrode of a semiconductor device, capable of forming the storage electrode to have a rough surface with hemispherical lugs by use of simplified deposition process and heat treatment using a single process tube to obtain a high capacitance in spite of a small cell area, thereby greatly improving the operation characteristic of the semiconductor device. The method includes the steps of bring a doped amorphous silicon film into contact with a portion of a substrate to be contact with the storage electrode, repeatedly forming an undoped amorphous silicon film and another doped amorphous silicon film over the doped amorphous silicon film at least one time, subjecting all the doped and undoped amorphous silicon films to a thermal treatment in an inert gas atmosphere for a time so that a dopant of each doped amorphous silicon film is diffused in a portion of the undoped amorphous silicon film while all the doped and undoped amorphus silicon films are crystallized into polysilicon films respectively; and etching the polysilicon films by use of a wet etch solution exhibiting an etch selectivity to an undoped one of the polysilicon film so that doped ones of the polysilicon films are etched at a higher rate than the undoped polysilicon film.

10 Claims, 5 Drawing Sheets

METHOD FOR FABRICATING STORAGE ELECTRODE OF SEMICONDUCTOR DEVICE

BACKGROUND OF THE INVENTION

1. Field of the Invention

The present invention relates to a method for fabricating a storage electrode of a semiconductor device.

2. Description of the Prior Art

Recent high integration trend of semiconductor memory devices involves inevitably an abrupt reduction in cell area. In spite of such a reduction in cell area, it is still required to establish a certain capacitance per cell in order to realize an operation of a semiconductor memory device. However, this is very difficult.

In a case of a super-integrated semiconductor device, in particular, a reduction in the capacitance of a capacitor results in an increased soft error caused by alpha ($\alpha$) particles.

In the technical field, development of new sophisticated techniques and establishment of reliability of devices have been strongly requisite for the establishment of a capacitance of a predetermine level or above.

For such a requirement, there have been proposed various storage electrode structures, one of which is to provide a rough surface of a capacitor so as to maximize the surface area of the capacitor. In this case, however, a very complex process involving, for example, use of hemispherical polysilicon should be used to obtain the rough surface structure of the capacitor.

Various three-dimensional storage electrode structures have also been proposed to increase the electrode surface area. Of these three-dimensional storage electrode structures, the pin structure has been mainly used because its fabrication is relatively simple. In the case of the pin structure, a certain capacitance may be obtained in spite of a reduced cell area by increasing the number of pins. However, such an increase in number of pins results in an increase in number of process steps because chemical vapor deposition (CVD) oxide films and CVD polysilicon films as conductive layers are repeatedly formed in an alternating manner, correspondingly to the increased number of pins. As a result, there are problems of an increased cost caused by the increase in the number of process steps and a degradation in yield caused by increased particles and increased defects generated due to the frequent use of the CVD process.

SUMMARY OF THE INVENTION

Therefore, an object of the invention is to solve the above-mentioned problems encountered in the prior art and, thus, to provide a method for fabricating a storage electrode of a semiconductor device, capable of forming the storage electrode to have a rough surface in a simplified manner and thereby obtaining a predetermined capacitance per cell required for an operation of the semiconductor memory device.

In accordance with the present invention, this object can be accomplished by providing a method for fabricating a storage electrode of a semiconductor memory device, comprising the steps of: bring a doped amorphous silicon film into contact with a predetermined portion of a substrate to be contact with the storage electrode; repeatedly forming an undoped amorphous silicon film and another doped amorphous silicon film over the doped amorphous silicon film at least one time; subjecting all the doped and undoped amorphous silicon films to a thermal treatment in an inert gas atmosphere for a predetermined time so that a dopant of each doped amorphous silicon film is diffused in a predetermined portion of the undoped amorphous silicon film while all the doped and undoped amorphus silicon films are crystallized into polysilicon films respectively; and etching the polysilicon films by use of a wet etch solution exhibiting an etch selectivity to an undoped one of the polysilicon film so that doped ones of the polysilicon films are etched at a higher rate than the undoped polysilicon film.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Referring to FIGS. 1A to 1D, there is illustrated a method for fabricating a storage electrode of a semiconductor device in accordance with an embodiment of the present invention.

Figure 1A:
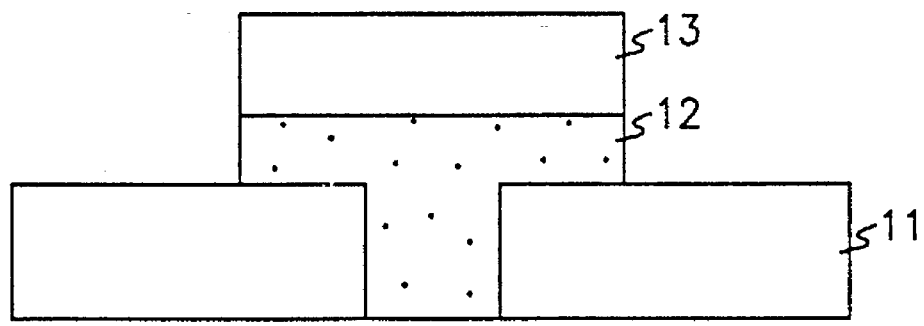
FIGS. 1A to 1D are sectional views respectively illustrating a method for fabricating a storage electrode of a semiconductor device in accordance with an embodiment of the present invention.

In accordance with this method, first, a planarizing insulating film 11 is formed over a substrate provided with a typical metal oxide semiconductor (MOS) transistor structure, as shown in FIG. 1A. A contact hole is then formed at a portion of the insulating film 11 corresponding to a predetermined portion of the substrate to contact a storage electrode. Over the entire exposed surface of the resulting structure, an amorphous silicon film 12 doped with phosphorous is then deposited to a thickness of 1,000 to 1,500Å. The deposition of the amorphous silicon film 12 is carried out at a temperature of 480° to 550° C. Subsequently, another amorphous silicon film 13 is deposited over the amorphous silicon film 12 to a thickness of about 2,000 to about 4,000Å in the same process tube as that used for the deposition of the amorphous silicon film 12. The deposition of the amorphous silicon film 13 is carried out under conditions of using the same temperature and pressure as those used for the deposition of the amorphous silicon film 12 and stopping a flow of $PH_3$. Upon the deposition of the amorphous silicon film 13, a flow of $PH_3$ is stopped in the process tube in order to prevent the amorphous silicon film 13 from being doped with phosphorous. Thereafter, the amorphous silicon films 13 and 12 are patterned using a mask for storage electrode (not shown).

Figure 1B:
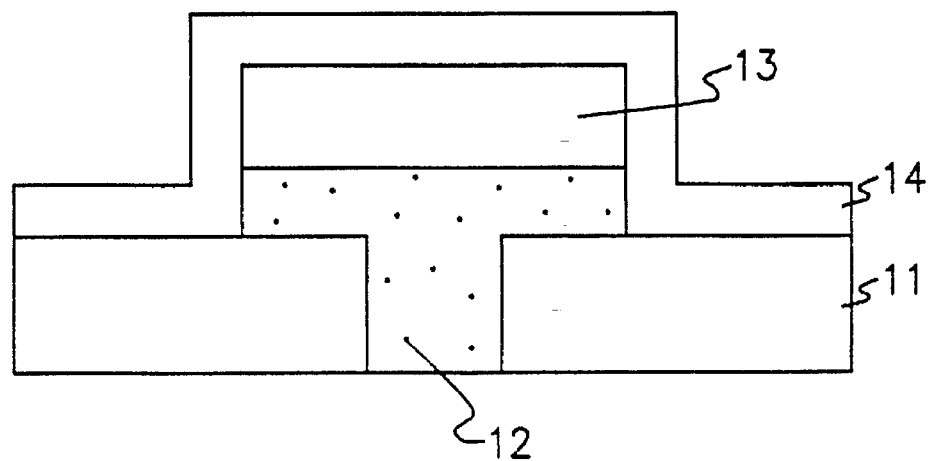

Over the entire exposed surface of the resulting structure, another amorphous silicon film 14 doped with phosphorous is then deposited to a thickness of 300 to 500Å, as shown in FIG. 1B. The deposition of the amorphous silicon film 14 is carried out at a temperature identical to or lower than those used for the amorphous silicon films 12 and 13.

Figure 1C:
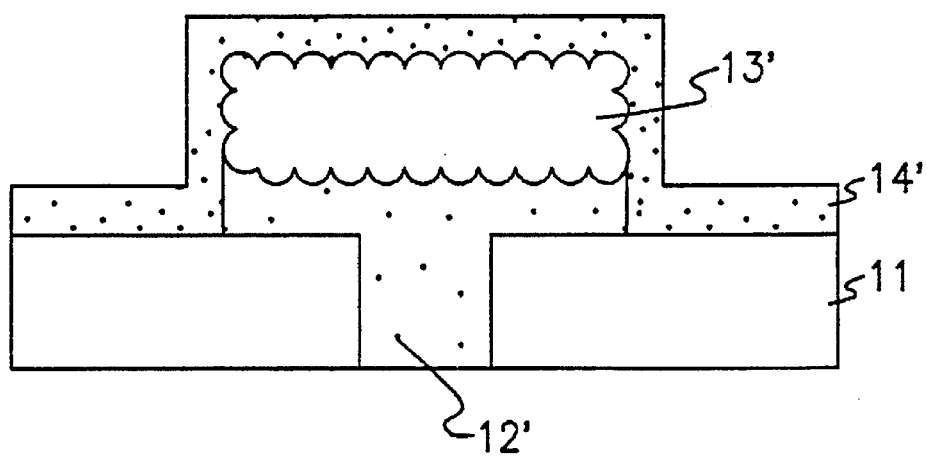

The resulting structure is then subjected to a thermal treatment at a temperature of 650° to 750° C. in an inert atmosphere containing an inert gas such as $N_2$ or Ar for about 30 to about 60 minutes, thereby causing the amorphous silicon films 12, 13 and 14 to be changed into polysilicon films 12', 13' and 14', respectively, as shown in FIG. 1C. During the thermal treatment, the impurity contained in the doped amorphous silicon films 12 and 14 are diffused in a predetermined portion of the undoped amorphous silicon film 13.

The above thermal treatment is adapted to utilize a diffusion characteristic as described below.

Upon being subjected to a heat treatment, doped amorphous silicon is forced into a transition of solid phase crystal growth changing the amorphous silicon into polysilicon. In this case, the internal impurity of the doped amorphous silicon is completely activated. By virtue of the activation, a residual part of the impurity is diffused in an undoped amorphous silicon film. As the undoped amorphous silicon film is also subjected to the heat treatment, it is crystallized into polysilicon. Although a complete grain size is established during the crystallization into polysilicon, the undoped amorphous silicon film is weak at grain boundary areas, thereby causing the diffusion of impurity therein to occur. In this case, the diffusion of impurity is begun at the weak grain boundary areas among crystal grains and then propagated into the crystal grains.

On the basis of such a diffusion characteristic, the diffusion at the grain boundary areas is carried out in the form of a V shape. Accordingly, the undoped amorphous silicon film subjected to the diffusion of phosphorous is formed with a rough surface, as shown in FIG. 1C. In this case, it is very important to control the diffusion of impurity such that the doped impurity is not diffused in bulks within crystal grains of polysilicon even though it is diffused in grain boundary areas among the crystal grains. In order to achieve the controlled diffusion, the thermal treatment should be carried out at the temperature of 650° to 750° for 30 to 60 minutes.

In particular, it is very important to carry out the deposition of each amorphous silicon film doped with phosphorous at the low deposition temperature of 480° to 550° C. in order to prevent a change of the internal micro structure of the amorphous silicon film.

Figure 1D:
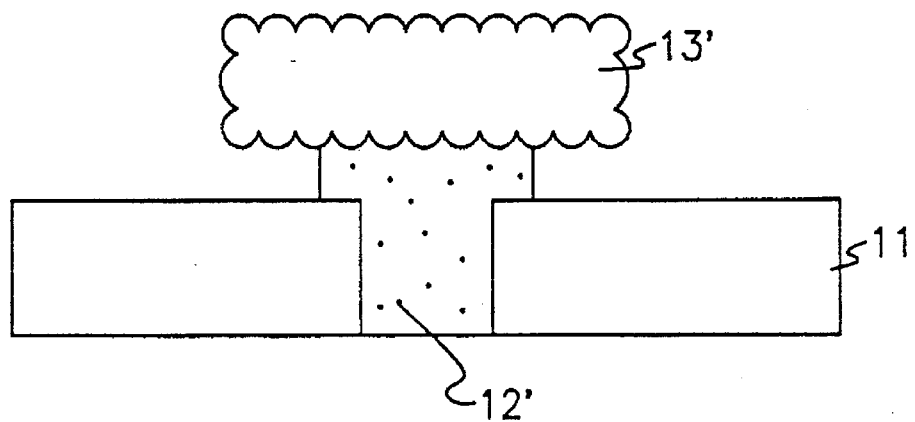

Finally, the polysilicon films 12' and 14' are wet etched using a wet etch solution, essentially consisting of a mixture of a water with nitric acid, acetic acid, and fluoric acid, exhibiting a superior etch selectivity to the undoped polysilicon so that the phosphorous-doped polysilicon films 12' and 14' are etched at a higher rate while the polysilicon film 13' not doped with phosphorous is etched at a lower rate. Thus, a storage electrode is obtained, as shown in FIG. 1D.

FIGS. 2A to 2E are sectional views respectively illustrating a method for fabricating a storage electrode of a semiconductor device in accordance with another embodiment of the present invention.

Figure 2A:
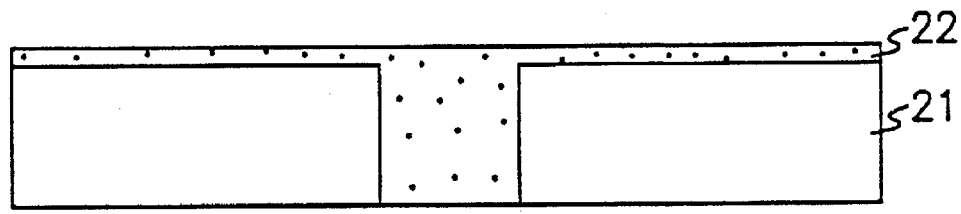
FIGS. 2A to 2E are sectional views respectively illustrating a method for fabricating a storage electrode of a semiconductor device in accordance with another embodiment of the present invention.

In accordance with this method, first, a planarizing insulating film 21 is formed over a substrate provided with a typical MOS transistor structure, as shown in FIG. 2A. A contact hole is then formed at a portion of the insulating film 21 corresponding to a predetermined portion of the substrate to contact a storage electrode. Over the entire exposed surface of the resulting structure, an amorphous silicon film 22 doped with phosphorous is then deposited.

Subsequently, an amorphous silicon film 23 not doped with phosphorous is deposited over the doped amorphous silicon film 22 to a thickness of 1,000 to 2,000Å. The deposition of the undoped amorphous silicon film 23 is carried out at a temperature of 480° to 550° C. in the same process tube as that used for the deposition of the amorphous silicon film 22. Another amorphous silicon film 24 doped with phosphorous is deposited over the undoped amorphous silicon film 23 to a thickness ranged from ⅓ to ½ of the thickness of amorphous silicon film 23. The deposition of the doped amorphous silicon film 24 is carried out under a condition of adding a $PH_3$ gas so as to obtain a very high concentration of phosphorous in the amorphous silicon film 23 and thereby supersaturate the phosphorous. Over the doped amorphous silicon film 24, another phosphorous-undoped amorphous silicon film 25 and another phosphorous-doped amorphous silicon film 26 are then deposited in a sequential manner.

Since such phosphorous-undoped and phosphorous-doped amorphous silicon films deposited over the amorphous silicon film 22 determine the number of pins finally constituting a storage electrode, they may be repeatedly deposited more increased times, if desired.

Figure 2B:
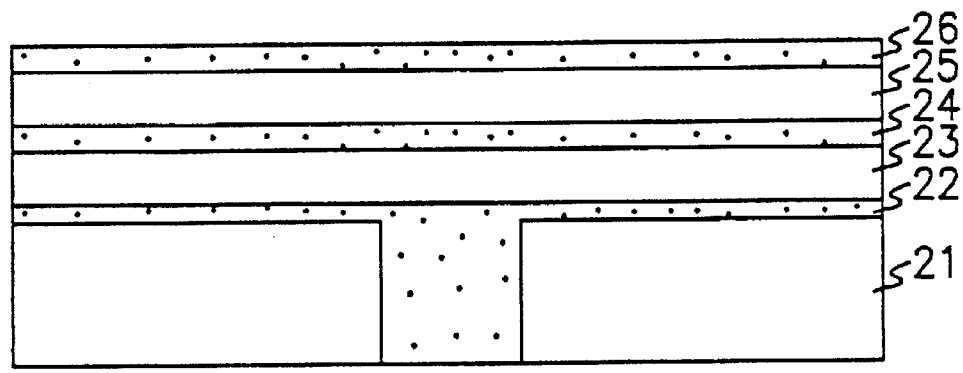

For simplicity of the description, FIG. 2B shows the case wherein phosphorous-undoped and phosphorous-doped amorphous silicon films are repeatedly formed two times.

Figure 2C:
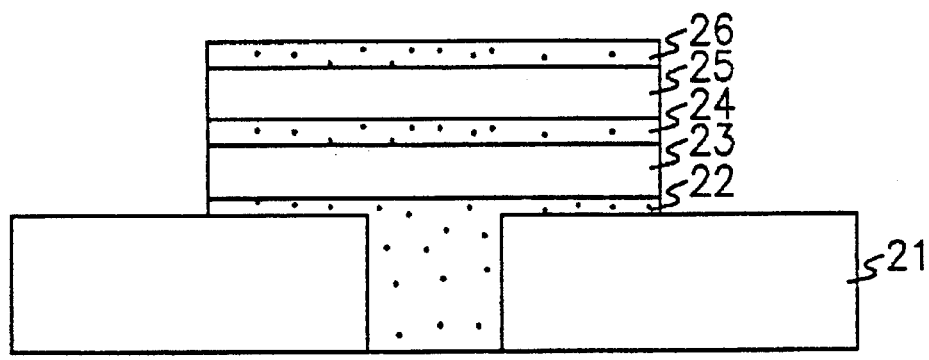

Thereafter, all the amorphous silicon films are patterned using a mask for storage electrode (not shown), as shown in FIG. 2C.

Figure 2D:
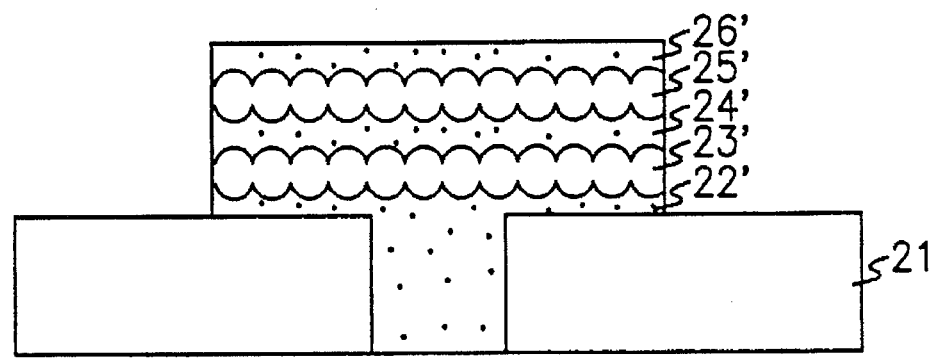

The resulting structure is then subjected to a thermal treatment at a temperature of 650° to 750° C. in an inert atmosphere for about 30 to about 60 minutes, thereby causing the amorphous silicon films 22, 23, 24, 25 and 26 to be crystallized into polysilicon films 22', 23', 24' 25' and 26', respectively, as shown in FIG. 2D. During the thermal treatment, the phosphorous contained in the doped amorphous silicon films are diffused in the undoped amorphous silicon films.

Figure 2E:
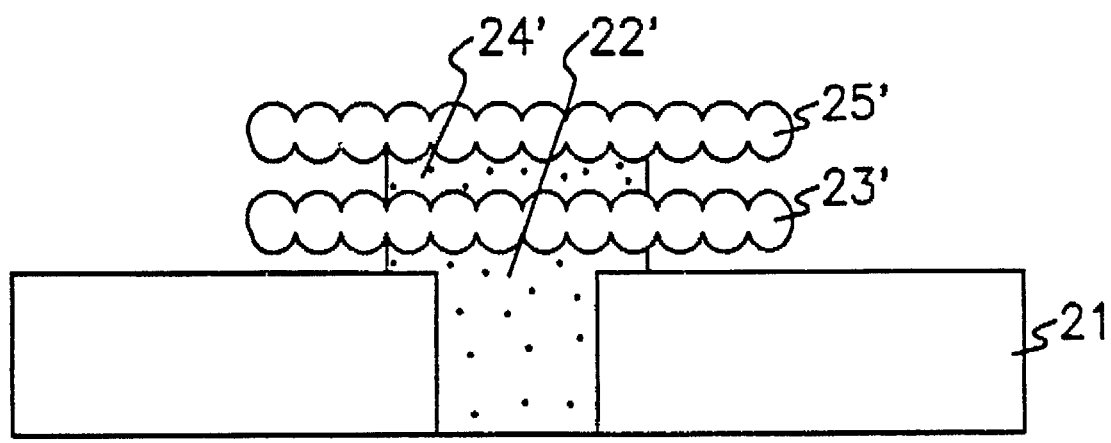

Finally, the polysilicon films 22' and 24' are wet etched using a wet etch solution, essentially consisting of a mixture of a water with nitric acid, acetic acid, and fluoric acid, exhibiting a superior etch so that the phosphorous-doped polysilicon films 22' and 24' are etched at a higher rate than those of the phosphorous-undoped polysilicon films 23' and 25'. Thus, a storage electrode having a rough surface with hemispherical lugs is obtained, as shown in FIG. 2E.

As apparent from the above description, the present invention provides a method for fabricating a storage electrode of a semiconductor device, capable of forming the storage electrode to have a rough surface with hemispherical lugs by use of simplified deposition process and heat treatment using a single process tube to obtain a high capacitance in spite of a small cell area, thereby greatly improving the operation characteristic of the semiconductor device.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating a storage electrode of a semiconductor memory device, comprising the steps of:

bringing a doped amorphous silicon film into contact with a portion of a substrate to be in contact with the storage electrode;

at least one time forming an undoped amorphous silicon film and another doped amorphous silicon film over the doped amorphous silicon film;

patterning the doped and undoped amorphous silicon films;

subjecting all the doped and undoped amorphous silicon films to a thermal treatment in an inert gas atmosphere so that dopants of each doped amorphous silicon film are diffused in a portion of the undoped amorphous silicon film while all the doped and undoped amorphous silicon films are crystallized into doped and undoped polysilicon films respectively wherein the thermal treatment is controlled for the dopants to be diffused into a grain boundary of the undoped polysilicon film; and selectively etching the doped polysilicon films by use of a wet etch solution, to leave remaining a portion of the doped polysilicon film in order that the undoped polysilicon film is electrically connected to the substrate, whereby the undoped polysilicon films have a rough surface while the doped polysilicon films are selectively etched.

2. A method in accordance with claim 1 wherein the formation of each of the doped amorphous silicon films is carried out at a temperature of 480° to 550° C.

3. A method in accordance with claim 1, wherein the thermal treatment is carried out at a temperature of 650° to 750° C. for 30 to 60 minutes.

4. A method in accordance with claim 1, wherein the wet etch solution consists essentially of a mixture of a water with a nitric acid, an acetic acid, and a fluoric acid.

5. A method in accordance with claim 1, wherein the doped amorphous silicon film is supersaturated with dopants.

6. A method in accordance with claim 1, wherein a thickness of the doped amorphous silicon film is less than a thickness of the undoped amorphous silicon film.

7. A method in accordance with claim 1, further comprising the steps of forming a doped amorphous silicon film prior to the thermal treatment.

8. A method for fabricating a storage electrode of a semiconductor memory device, comprising the steps of:

bringing a doped amorphous silicon film into contact with a portion of a substrate to be in contact with the storage electrode;

at least one time forming an undoped amorphous silicon film and another doped amorphous silicon film over the doped amorphous silicon film;

subjecting all the doped and undoped amorphous silicon films to a thermal treatment in an inert gas atmosphere so that dopants of each doped amorphous silicon film are diffused in a portion of the undoped amorphous silicon film while all the doped and undoped amorphous silicon films are crystallized into doped and undoped polysilicon films respectively, wherein the thermal treatment is controlled for the dopants to be diffused into a grain boundary of the undoped polysilicon film; and patterning the doped and undoped polysilicon films;

selectively etching the doped polysilicon films by use of a wet etch solution, to leave remaining a portion of the doped polysilicon film in order that the undoped polysilicon film is electrically connected to the substrate, whereby the undoped polysilicon film has a rough surface while the doped polysilicon film is selectively etched.

9. A method in accordance with claim 8, wherein the formation of each of the doped amorphous silicon films is carried out at a temperature of 480° to 550° C.

10. A method in accordance with claim 8, wherein the thermal treatment is carried out at a temperature of 650° to 750° C. for 30 to 60 minutes.

* * * * *